United States Patent
Tuovinen et al.

Patent Number: 5,670,965
Date of Patent: Sep. 23, 1997

[54] COMPACT ANTENNA TEST RANGE

[76] Inventors: Jussi Tuovinen, Porslahdentie 23 E 26, FIN-00980 Helsinki; Antti Vasara, Vuorimiehenkatu 11 A 1, FIN-00140 Helsinki; Antti Räisänen, Visakoivuntie 2 A, FIN-02130 Espoo, all of Finland

[21] Appl. No.: 185,805

[22] PCT Filed: Jul. 29, 1992

[86] PCT No.: PCT/FI92/00221

§ 371 Date: May 24, 1994

§ 102(e) Date: May 24, 1994

[87] PCT Pub. No.: WO93/03388

PCT Pub. Date: Feb. 18, 1993

[30] Foreign Application Priority Data

Aug. 1, 1991 [FI] Finland .................. 913685

[51] Int. Cl.$^6$ ................ H01Q 15/02; H01Q 19/06
[52] U.S. Cl. ................ 343/703; 343/753; 343/909
[58] Field of Search ............... 343/703, 753, 343/754, 909, 910, 911 R; H01Q 15/02, 19/06

[56] References Cited

U.S. PATENT DOCUMENTS

| | | | |
|---|---|---|---|
| 3,189,907 | 6/1965 | Van Buskirk | 343/753 |
| 3,392,393 | 7/1968 | Spitz | 343/909 |
| 4,949,093 | 8/1990 | Dhanjal | 343/755 |
| 5,001,494 | 3/1991 | Dorman et al. | 343/703 |
| 5,119,105 | 6/1992 | Ngai et al. | 343/703 |

FOREIGN PATENT DOCUMENTS 415633  10/1974  U.S.S.R.

OTHER PUBLICATIONS

Ginsburg, V. M., et al. Soviet Inventions Illustrated 1975, Week 7511. 1661854/26–9.

Kurochkin, A P, Derwent's Abstract, No. 85–183 011/30, Publ. Week 8530, SU 1134–919–A, Mar. 1975.

Lee, W. "Computer–Generated Holograms ..." Progress in Optics XVI, E. Wolf, North–Holland pp. 121–232.

Witse, J.C. et al. "The Fresnel Zone Plate Antenna", Microwave Journal, Jan. 1991 pp. 101–114.

Garrett, J.E. et al "Fresnel Zone ..." International Journal of Infrared and Millimeter Waves, vol. 12, No.3, 1991 pp. 195–220.

Herman, M.H. "Zone Plate Theory ...", Applied Optics, vol. 6, No. 2, Feb. 1967 pp. 317–322.

Vasara, A. et al. "Realization of General .." Journal of the Optical Society of America (1989) pp. 1–8.

*Primary Examiner*—Michael C. Wimer
*Attorney, Agent, or Firm*—Ladas & Parry

[57] ABSTRACT

A compact antenna test range for performing antenna and radar cross-section measurements has a transmitter for transmitting an electromagnetic wavefront and at least one radio frequency hologram for receiving the wavefront, converting the wavefront into a plane wave, and passing on the plane wave at an oblique angle with respect to a central axis of the hologram for illuminating a piece to be tested.

4 Claims, 1 Drawing Sheet

COMPACT ANTENNA TEST RANGE

BACKGROUND OF THE INVENTION

The invention relates to a compact antenna test range for performing antenna and radar cross-section measurements. The test range comprises (i) transmitting means for transmitting an electromagnetic wave, (ii) transducer means for converting the wavefront transmitted by the transmitting means to a plane wave, and (iii) a piece to be tested, located in such a way that the plane wave to be obtained from the transducer means hits it.

By means of antenna test methods, characteristics of an antenna are measured, viz. radiation pattern, polarization, gain or directivity, for instance. These methods can be divided into three main groups, i.e. measurements (1) in the far field, (2) in the near field, and (3) in a compact antenna test range.

In far field measurements, a plane wave field is formed by means of a separate transmitting antenna in front of the antenna to be tested. The transmitting antenna shall be located at a sufficient distance from the antenna to be tested so that a wave of spherical phase front type coming from the transmitting antenna would approximate well enough the plane wave in front of the antenna to be tested. In general, it is considered that the far field starts at the distance $2D^{2/\lambda}$, where D is the diameter of an aperture of the antenna to be tested and $\lambda$ is the wavelength. This is, however, not a sharp limit, because the dependence of the antenna characteristics on the distance at which they are measured weakens when the distance increases. At the determination of the distance of the far field, the important thing is how large an error is allowable with respect to the actual circumstances in the far field. The far field distance mentioned above has been obtained when a phase difference of 22.5 degrees is permitted in the aperture of the antenna to be tested. The distance of the far field for large antennas will be impracticably large anyway; it can be several kilometres and, therefore, the test must always be performed outdoors in these cases.

In the near field measurements, generally performed in an anechoic chamber, the field in front of the antenna to be tested is measured. The characteristics of the far zone are calculated from the measured near-field results. This method is generally used at frequencies below 40 GHz in the first place. At frequencies higher than that, a problem will arise due to phase errors caused by measuring cables and inaccurate measuring points and, especially in connection with large antennas, by an immense number of measuring points, because the field must be measured at intervals of at least half of a wavelength. Each measuring event is cumbersome under these circumstances.

A Compact Antenna Test Range (CATR) is a test range in which an artificial far field, i.e. a plane wave, is formed in front of the antenna under test. The actual antenna test is performed in a manner similar to that used in ordinary far field measurements. The desired plane wave is formed from a spherical wave by means of a focusing element. Up till now, curved metal reflectors have nearly exclusively been used for forming the plane wave. The principle of such a test range has been described e.g. in U.S. Pat. No. 3,302,205 in the embodiments of which either one rotational parabola reflector of two cylindrical parabolic reflectors are used for forming the plane wave.

With respect to far field measurements, an advantage of a compact test range is that it is small enough in size to be located indoors, under protection from the influence of weather conditions, even if the antenna is large. With respect to near field measurements the advantage is that each measurement can be performed easily, after the range is in its place, as a normal far field measurement, e.g. by rotating the antenna under test. A further advantage is also that it enables an indoor measurement of the radar cross-section of even large objects. The use of a compact antenna test range for measurements is in some cases also the only reasonable alternative, e.g. in cases if a near field measurement cannot be performed or the atmospheric attenuation is strong and varies as a function of time. However, a compact antenna test range is expensive (especially within millimeter wave region) because of high manufacturing costs of reflectors. This is due to the need for surface accuracy of the reflectors of about 1/100 of a wavelength. At the frequency of 100 GHz, for instance, the surface accuracy must thus be in the range of 30 µm. As an example, the data of a commercially available compact test range are given:

surface accuracy of reflector 20 µm (can be used up to 200 GHz)
weight of reflector about 50,000 kg
quiet zone (plane wave section) 5.5 m×5 m
manufacturing costs of reflector about 5 million marks.

SUMMARY OF THE INVENTION

The object of the present invention is to get rid of the drawbacks described above and to provide a compact antenna test range that is clearly less expensive to construct than the previous one. This is achieved by the test range of the invention in that the transducer means comprises at least one hologram.

The basic idea of the invention is to form an artificial far field required for a compact antenna test range by means of a hologram.

The manufacturing costs of the test range of the invention are only a fraction of the manufacturing costs of a traditional compact test range realized by reflectors. The requirement on the surface accuracy of the hologram to be used is less so that the test range of the invention is suitable for being used as a test range at even very high frequencies (over 300 GHz). Moreover, the test range of the invention is light.

The hologram or holograms to be used for the compact antenna test range of the invention are known per se. They can be designed and manufactured in the same way as the computer generated holograms used in optics, for instance. Such holograms are described e.g. in reference R1 (in a list of references cited at the end of this specification).

The general information on holograms that follows is meant to give the reader a background. Holograms can be divided into two main categories: transmission and reflection holograms. In general, a hologram changes both the amplitude and the phase of the field. In practice, however, many holograms are used which change only one of the field parameters, i.e. so-called amplitude or phase holograms are used.

In the prior art, holograms have been used not only in optics as noted above, but also within the radio frequency band, in which transmission holograms have replaced lens antennas and reflection holograms, parabolic antennas, for example. Within the radio frequency band, however, holograms have been used only far field applications and not at all in near field conditions, as in the present invention. Special cases of holograms and their use within the radio frequency band are described references R2 and R3 of the list at the end of this specification.

BRIEF DESCRIPTION OF THE DRAWINGS

In the following, the invention will be described in greater detail by referring to the example of the enclosed drawing, in which.

DETAILED DESCRIPTION OF THE INVENTION

Figure 1:
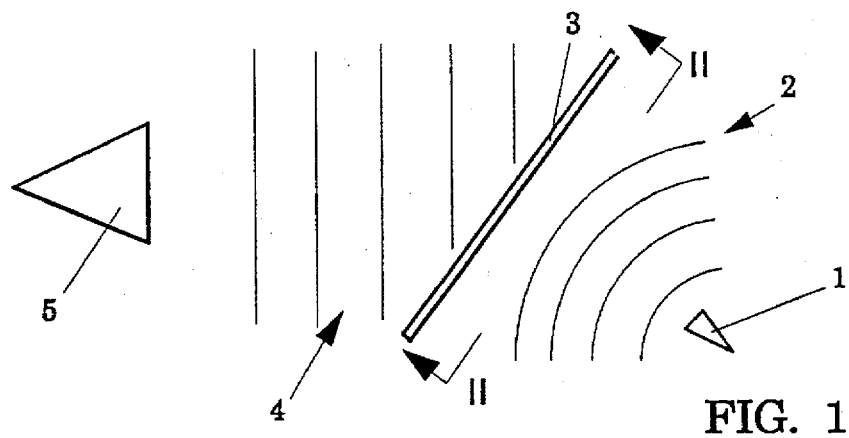
FIG. 1 shows the principle of a test arrangement of a compact antenna test range according to the invention from above.

FIG. 1 shows the principle of a test arrangement of a compact antenna test range according to the invention from above. A transmitting means consists of an antenna, such as a horn antenna 1, transmitting a spherical wave 2 in the direction of its main beam toward a transmission amplitude hologram 3. The hologram is located in the near field of the antenna 1 (but can also be located in the far field) at a suitable height from the floor. The central axis of the hologram is defined as the line parallel with the normal of the plane of the hologram and going through the hologram center point.

In this example, the horn antenna 1 is placed on the central axis of the hologram 3 and, moreover, in such a way that the edge of the hologram lies at −3 dB in the beam of the horn. The hologram 3 is designed in such a manner that a plane wave 4 leaves at an oblique angle (of about 30 degrees in this example) with respect to the central axis. By doing so the plane wave can be separated from the detrimental waveforms leaving from the hologram in the direction of central its axis.

Within a region (quiet-zone) of the plane wave 4 is located a piece 5 to be tested, which in the example of the figure is shown as a horn antenna and which is in a normal manner provided with turning and transfer equipment (not shown) to turn and transfer it to a suitable position with respect to the plane wave.

The test range naturally also comprises transmitting means coupled to the antenna 1 as well as measuring means coupled to the piece 5 to be tested and/or to the antenna 1 for performing measurements. Since these arrangements are known per se, however, and since the measurements are performed in a manner known per se, they are not described in greater detail.

If the intention is to perform antenna tests, the piece 5 to be tested in an antenna and the measuring means are coupled to it. On the other hand, if the intention is to measure the radar cross-section of the piece 5, such as a radar reflector or a scale model of an aeroplane, which measurement is performed by transmitting a radar pulse to the piece by means of the antenna 1 and by receiving the echo reflected from the piece by means of the same antenna, the measuring means are coupled to the antenna 1.

Figure 2:
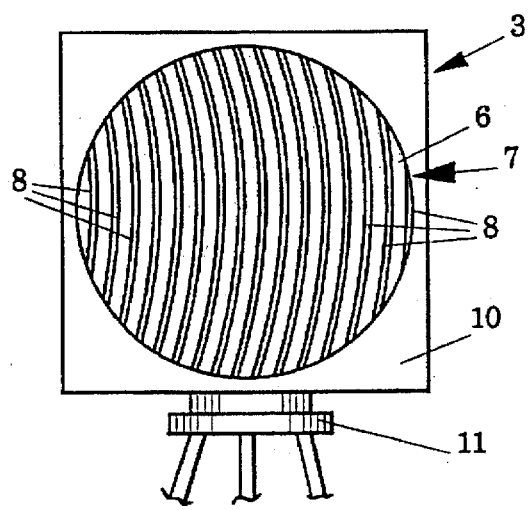
FIG. 2 shows a hologram to be used for the test range of FIG. 1 in the direction of line II—II of FIG. 1.

FIG. 2 shows more accurately the hologram 3, comprising a (circular) substrate 6 permeable to radio waves and a pattern 7 impermeable to radio waves on the surface of the substrate. The resulting permeable and impermeable pattern together form the hologram pattern. The hologram pattern is manufactured on the surface of the substrate by etching in a way similar to that used in printed circuit board techniques by means of a mask corresponding to the hologram pattern. In this example, the hologram pattern 7 is formed by parallel vertical curved copper strips 8 and slots between them. In this example, the substrate 6 consists of 0.075 mm thick KAPTON™ film and the hologram pattern consists of 0.035 mm thick copper layer. The manufacturing costs of a simple metallized plastic film like this are about 1000 m² being only a fraction of the manufacturing costs of a reflector used traditionally.

The hologram 3 is fastened to a frame 10, which is coated by a material (not shown) that absorbs the radio waves. The frame 10 is positioned on a pedestal 11 in such a way that it can be turned into a position desired with respect to the coming wavefront 2.

Figure 3:
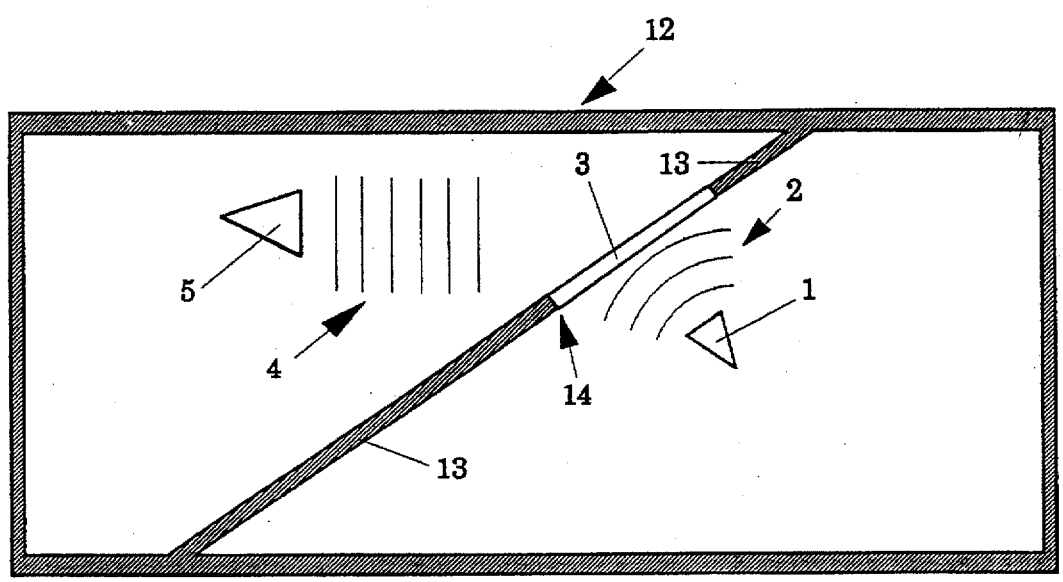
FIG. 3 shows a preferable embodiment of the principle of the test arrangement to FIG. 1 from above.

FIG. 3 shows a preferred embodiment of the test arrangement of FIG. 1 from above. In this case, a test chamber 12 has been provided with a partition wall 13 coated by a material (not shown) that absorbs radio waves, the wall having an aperture 14 in which the hologram 3 is fastened. In this way it is possible to assure that the wavefront transmitted by the transmitting means is not able to pass the hologram and to propagate to the piece 5 to be tested.

Though the invention has above been described by referring to the example of the enclosed drawing, it is clear that the invention is not restricted to it, but can be modified in many ways within the scope of the inventive idea presented above and in the claims enclosed. For instance, the type of hologram and, especially, the hologram pattern can vary in many ways and one skilled in the art is able to design a hologram easily after the changes in the amplitude and phase of the wave transmitted by the transmitting means are known in the desired plane of the hologram. Under these circumstances, the coming wavefront can, in principle, enter the hologram from any direction and the plane wave leave in any direction if the plane wave leaves in a direction different from that of the other detrimental waveforms from the hologram. Consequently, the form of the wave transmitted by the transmitting means is not bound to be a spherical wave (nor are the transmitting means bound to be a horn antenna). The hologram used in the test range does not absolutely need to be transmitting, either. It could be a reflection hologram, instead which comprises a flat reflector provided with grooves instead of copper patterns and as above. Cascaded holograms (more than one) can also be used in the test range. Because the test range enables, besides antenna tests, also measurements of e.g. radar cross-sections, the expression "antenna test range" used in the enclosed claims shall be understood to include also other measurements than antenna tests.

References:

R1. Wai-Hon Lee: "Computer Generated Holograms: Techniques and Applications", ed. E. Wolf, Progress in Optics XVI, North-Holland, 1978.

R2. J. C. Wiltse, J. E. Garrett: "The Fresnel Zone Plate Antenna", Microwave Journal, January 1991, pages 101 to 114.

R3. J. C. Wiltse, J. E. Garrett: "Fresnel Zone Plate Antennas at Millimeter Wavelengths", International Journal of Infrared and Millimeter Waves, Vol. 12, no. 3, 1991, pages 195 to 220.

We claim:

1. A compact antenna test range for performing antenna and radar cross-section measurements, the compact test range comprising
   transmitting means for transmitting an electromagnetic wavefront,
   converting means for converting the wavefront to plane waves, said converting means
   a) generating the plane waves and detrimental waves when illuminated by said transmitting means,
   b) comprising at least one hologram pattern formed on a substrate, said hologram pattern failing to show concentric rings and being designed so that, when illuminated by said transmitting means, it spatially separates the plane waves from the detrimental waves by making the plane waves and the detrimental waves to leave the hologram pattern at different angles, and a piece to be tested, positioned in such a way that the plane waves leaving the hologram pattern illuminate the piece.

2. The compact antenna test range according to claim 1, wherein the plane waves leave said hologram pattern at an oblique angle with respect to a central axis of said hologram pattern.

3. The compact antenna test range according to claim 1, wherein said hologram pattern is computer generated.

4. The compact antenna test range according to claim 3, wherein the plane waves leave said hologram pattern at an oblique angle with respect to a central axis of said hologram pattern.

* * * * *